(12) United States Patent
Maeda et al.

(10) Patent No.: US 8,710,608 B2
(45) Date of Patent: Apr. 29, 2014

(54) SOLID-STATE IMAGING DEVICE, METHOD FOR MANUFACTURING SOLID-STATE IMAGING DEVICE, AND ELECTRONIC APPARATUS

(75) Inventors: Kensaku Maeda, Kanagawa (JP);
Hiroyasu Matsugai, Kanagawa (JP);
Yusuke Moriya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/809,522

(22) PCT Filed: Jul. 8, 2011

(86) PCT No.: PCT/JP2011/065733
§ 371 (c)(1),
(2), (4) Date: Feb. 12, 2013

(87) PCT Pub. No.: WO2012/008387
PCT Pub. Date: Jan. 19, 2012

(65) Prior Publication Data
US 2013/0134540 A1 May 30, 2013

(30) Foreign Application Priority Data
Jul. 15, 2010 (JP) .................... 2010-161083

(51) Int. Cl.
*H01L 31/0232* (2006.01)
(52) U.S. Cl.
USPC .... 257/432; 257/291; 257/292; 257/E31.127; 438/69
(58) Field of Classification Search
USPC ................... 257/233, 292, 431–466
See application file for complete search history.

(56) References Cited

U.S. PATENT DOCUMENTS

2007/0215204 A1* 9/2007 Maehara .................. 136/256

FOREIGN PATENT DOCUMENTS

| JP | 04-226073 | 8/1992 |
| JP | 2003-338613 | 11/2003 |
| JP | 2005-045141 | 2/2005 |
| JP | 2006-073885 | 3/2006 |
| JP | 2006-120845 | 5/2006 |

OTHER PUBLICATIONS

International Search Report; International Application No. PCT/JP2011/065733; Date of actual completion of international search report: Jul. 25, 2011.
Written Opinion of the International Searching Authority; International Application No. PCT/JP2011/065733; Dated Jul. 8, 2011.

* cited by examiner

*Primary Examiner* — Mamadou Diallo
(74) *Attorney, Agent, or Firm* — Rader, Fishman & Grauer PLLC (57) ABSTRACT

The present invention relates to a solid-state imaging device having good focusing properties, a method for manufacturing such a solid-state imaging device, and an electronic apparatus. The solid-state imaging device has a semiconductor substrate 11 and a photoelectric conversion part formed in the semiconductor substrate 11. In the solid-state imaging device, a laminate including an organic material layer and an inorganic material layer is formed on the semiconductor substrate with at least one stress relaxation layer 22 interposed between the organic and inorganic material layers. This technology is applicable to, for example, solid-state imaging devices having pixels and microlenses placed thereon.

7 Claims, 7 Drawing Sheets

FIG. 9

SOLID-STATE IMAGING DEVICE, METHOD FOR MANUFACTURING SOLID-STATE IMAGING DEVICE, AND ELECTRONIC APPARATUS

TECHNICAL FIELD

The present invention relates to a solid-state imaging device having microlenses arranged on pixels, a microlens-equipped solid-state imaging device, and an electronic apparatus having a solid-state imaging device.

BACKGROUND ART

Recently, camera module-equipped electronic apparatuses such as cellular phones have been required to be smaller and thinner. Thus, a traditional package structure including a ceramic package, in which a solid-state imaging device is placed, and a surface-bonded glass sheet for sealing the package is failing to meet the size and thickness reduction requirements.

Thus, a flip-chip mounted package structure has been developed, which includes a microlens array and a glass sheet bonded directly onto the microlens array. For example, a relatively hard transparent material is provided as a protective layer to cover the on-chip microlenses. Such a protective layer can eliminate the need for a special package, and can reduce the number of processes for individual solid-state imaging device chips after dicing, so that the process can be simplified. In addition, the protective layer is relatively hard and has a planarized surface. Thus, even if dust is deposited on the protective layer, it can be easily wiped off with no scratches on the protective layer.

In recent years, as solid-state imaging devices have been made with a smaller size and a higher density of pixels, there has been the problem of sensitivity reduction, which is caused by a reduction in photoelectric conversion part area. To solve this problem, there has been provided a color solid-state imaging device having microlenses on photoelectric conversion parts.

In a conventional microlens structure, when the lens aperture diameter of the video camera is sufficiently small and when light is perpendicularly incident on the color solid-state imaging device, the incident light is converged on the photoelectric conversion parts with no problem. When the video camera lens is set close to full aperture, however, an oblique light component that cannot be converged on the photoelectric conversion parts increases, so that the color solid-state imaging device will have a problem in that its sensitivity is not effectively improved.

Figure 7:
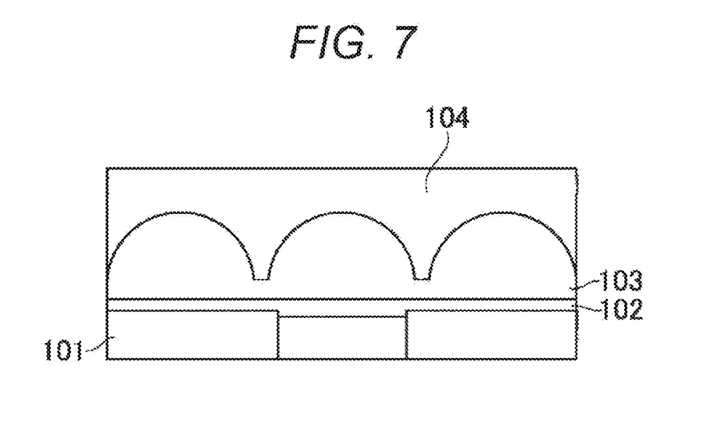
FIG. 7 is a cross-sectional view showing the structure of a conventional solid-state imaging device.

To solve this problem, there has been proposed a solid-state imaging device structure having microlenses and a planarized transparent resin material provided on the microlenses so that the uppermost surface of the solid-state imaging device is substantially flat. FIG. 7 schematically shows the structure of the solid-state imaging device having such a structure, which includes color filters and upper components. In the solid-state imaging device of this structure, a planarizing layer 102 is provided on color filters 101, and a microlens layer 103 is provided on the planarizing layer 102. In addition, a transparent resin layer 104 with a planarized surface is provided on the microlens layer 103.

Unfortunately, if there is only a small difference between the refractive index n1 of the microlens layer 103 and the refractive index n2 of the transparent resin layer 104, the light-converging function of the microlens layer 103 will be insufficient. Specifically, the collection efficiency of the light-collecting structure having microlenses and a planarizing resin film as shown in FIG. 7 is half or less of the collection efficiency of a traditional light-collecting structure having an air layer above the microlens layer 103.

There has been proposed a technique for solving the problem with the light collection properties, which provides a structure including microlenses and a transparent resin layer, wherein the microlenses have a refractive index higher than that of the transparent resin layer (see, for example, Patent Document 1). In this structure, the focusing performance of the microlenses can be kept at a satisfactory level even when the light-receiving surface is covered with resin or the like. More specifically, this technique includes forming microlenses by an etch back process using silicon nitride (SiN).

Figure 8:
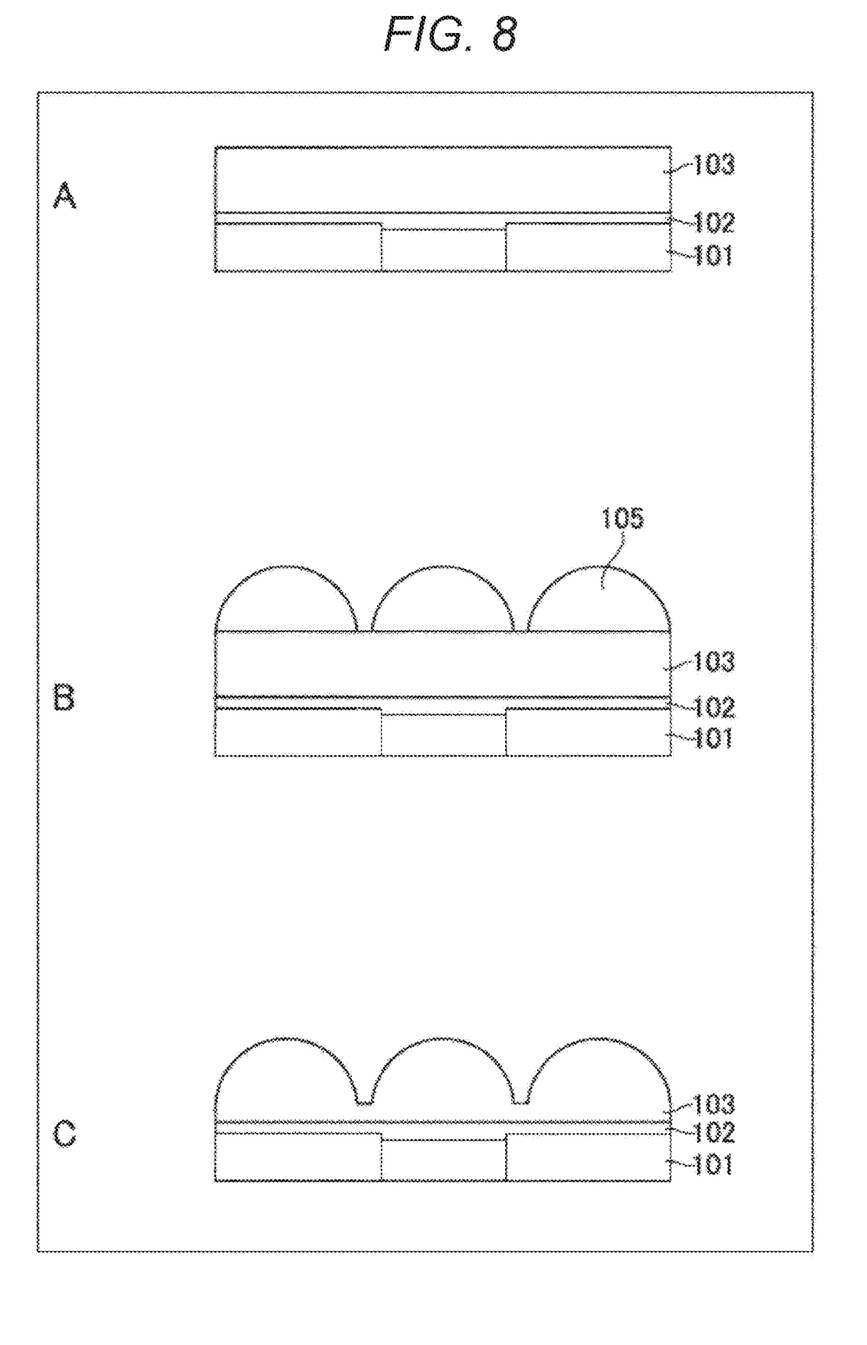
FIGS. 8A to 8C are diagrams showing a process for manufacturing a conventional solid-state imaging device.

FIGS. 8A to 8C show a method of forming microlenses by an etch back process.

In the etch back process, a planarizing layer 102 is formed on color filters 101 as shown in FIG. 8A. An optically-transparent microlens layer 103 film is then formed on the planarizing layer 102 by plasma CVD (chemical vapor deposition), for example, using silicon nitride (SiN). A resist layer 105 is then formed on the microlens layer 103. As shown in FIG. 8B, the resist layer 105 is patterned into lens shapes by photolithography, and then heat-treated, so that a patterned resist is formed. As shown in FIG. 8C, the microlens layer 103 is then etched into lens shapes using the lens-patterned resist layer 105 as a mask.

In this structure, the microlenses made of a silicon nitride (SiN) film have a refractive index of about 2. The transparent resin with which the microlenses are covered is a resin with a refractive index of about 1.5, such as an acrylic resin, an epoxy resin, or a styrene resin. Thus, the microlenses offer reliable focusing performance. In the plasma CVD, the silicon nitride film needs to be properly formed at a temperature sufficiently lower than the heat-resistant temperature of the organic resin and the color filters.

CITATION LIST

Patent Document

Patent Document 1: Japanese Patent Application Laid-Open No. 2003-338613

SUMMARY OF THE INVENTION

Problems to be Solved by the Invention

However, the method of forming microlenses using the etch back process includes forming a transparent planarizing layer to planarize the top of the color filters and forming the silicon nitride (SiN) film on the planarizing layer. When the color filters are arranged, for example, in the Bayer pattern of green, red, and blue, they need to have optimal spectral characteristics for each color in order to improve the sensitivity characteristics and the color reproducibility of the solid-state imaging device. Thus, the color filters usually have different thicknesses for different colors. Thus, the process of planarizing the top of the color filters with a transparent planarizing layer is usually performed to stabilize the photolithographic process for forming the microlenses.

The transparent planarizing layer is preferably made of an inexpensive transparent material with heat resistance and other properties. Thus, acrylic resin materials, styrene resin materials, and epoxy resin materials are usually used. In addition, to improve the focusing properties of the solid-state imaging device, it is essential to make the vertically layered structure thin. Thus, it is desired to form a thinner planarizing layer. To meet the requirements, the transparent planarizing layer is preferably formed using the resin material having both thermoplastic and thermosetting properties.

On the other hand, resin materials such as the acrylic, styrene, and epoxy resin materials generally have a low film stress. Particularly, resin materials having both thermoplastic and thermosetting properties have a significantly low film stress. In contrast, the silicon nitride (SiN) film used to form the microlens layer tends to have a high film stress when having both transparency and high refractive index.

Figure 9:
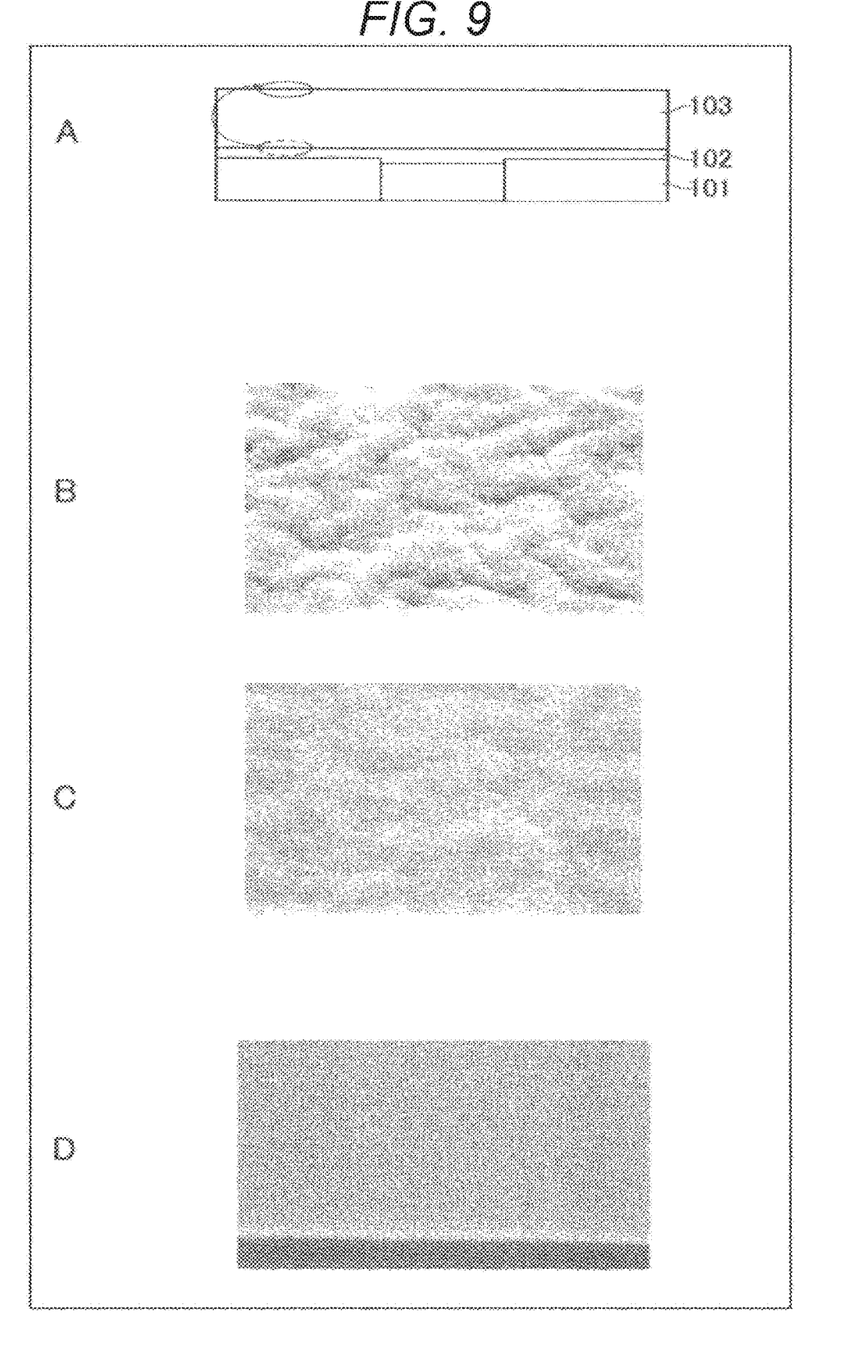
FIG. 9A is a cross-sectional view showing the structure of a conventional solid-state imaging device.
FIGS. 9B and 9C are drawings showing surface defects formed on a microlens layer.
FIG. 9D is a drawing showing a defect-free surface of a microlens layer.

If a laminate is formed using a resin material and a material, such as SiN, having a film stress significantly different from that of the resin material, a problem such as wrinkling or distortion can occur on the surface of the microlens layer 103 as shown in FIG. 9A. FIGS. 9B and 9C show surface defects of the microlens layer 103 caused by surface wrinkling and distortion. FIG. 9D shows, for comparison with FIGS. 9B and 9C, the defect-free surface of the microlens layer 103. The wrinkling and distortion occur at the interface between the planarizing layer 102 and the microlens layer 103. The wrinkling and distortion generated at the interface between the planarizing layer 102 and the microlens layer 103 are then similarly transferred to the surface of the microlens layer 103.

If surface defects such as wrinkling and distortion are generated as described above due to a layered structure with a significant difference in film stress, the risk of defocusing may be significant in the exposure step of a photolithographic process for forming a resist layer in a lens pattern. This can degrade the in-plane uniformity of the wafer or the line width uniformity in the chip and can cause degradation of the focusing properties of the solid-state imaging device.

To solve the problems described above, it is an object of the present invention to provide a solid-state imaging device having good focusing properties, a solid-state imaging device, and an electronic apparatus having sufficiently high sensitivity characteristics.

Solution to Problems

A solid-state imaging device of the present invention includes: a semiconductor substrate; a photoelectric conversion part formed in the semiconductor substrate; a laminate including an organic material layer and an inorganic material layer placed on the semiconductor substrate; and at least one stress relaxation layer interposed between the organic material layer and the inorganic material layer.

The electronic apparatus of the present invention includes the solid-state imaging device, an optical system for guiding incident light to the imaging part of the solid-state imaging device, and a signal processing circuit for processing an output signal from the solid-state imaging device.

A method for manufacturing a solid-state imaging device of the present invention includes the steps of: forming a photoelectric conversion part in a semiconductor substrate; and forming a laminate including an organic material layer and an inorganic material layer on the semiconductor substrate with at least one stress relaxation layer interposed between the organic material layer and the inorganic material layer.

In the solid-state imaging device and in the method for manufacturing the solid-state imaging device, the inorganic material layer and the organic material layer are formed on the semiconductor substrate with the stress relaxation layer interposed between the inorganic material layer and the organic material layer. There is a significant difference in film stress between the inorganic material layer and the organic material layer, but the stress relaxation layer is provided to attenuate the film stress difference, which successfully suppresses surface defects caused by the film stress difference at the interface of each layer. Thus, the solid-state imaging device can have improved focusing properties.

The electronic apparatus of the present invention is equipped with the solid-state imaging device with focusing properties improved by the suppression of surface defects, so that the electronic apparatus of the present invention can have higher sensitivity.

Effects of the Invention

The present invention makes it possible to provide a solid-state imaging device with good focusing properties and to provide an electronic apparatus with sufficiently high sensitivity characteristics.

MODE FOR CARRYING OUT THE INVENTION

Figure 1:
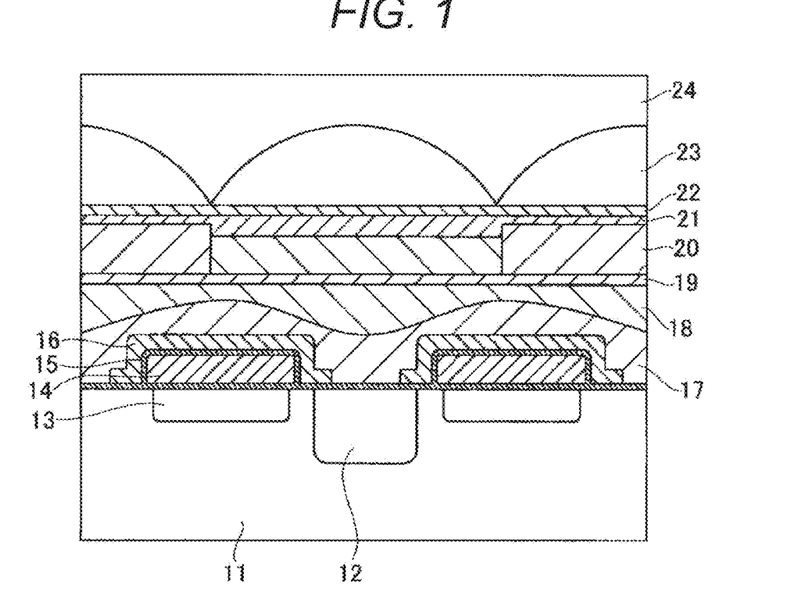
FIG. 1 is a cross-sectional view showing the structure of a solid-state imaging device according to a first embodiment of the present invention.

Hereinafter, the best mode for carrying out the present invention is described with reference to some examples below, which are not intended to limit the present invention. The description is made in the following order:
1. First embodiment of solid-state imaging device
2. Second embodiment of solid-state imaging device
3. Third embodiment of solid-state imaging device
4. Method for manufacturing solid-state imaging device
5. Embodiment of electronic apparatus 1. First Embodiment of Solid-State Imaging Device Hereinafter, a specific embodiment of the solid-state imaging device of the present invention is described. FIG. 1 is a cross-sectional view schematically showing the structure of a CCD (charge coupled device) solid-state imaging device as the solid-state imaging device of this embodiment.

Although not shown specifically, the imaging part of the CCD solid-state imaging device according to this embodiment has a large number of long stripe-shaped charge transfer parts formed in parallel along a single direction (vertical transfer direction). In a space between each set of adjacent charge transfer parts, photoelectric conversion parts for a row of pixels are disposed in a row parallel to the charge transfer parts. A read gate part for each pixel is provided between the row of photoelectric conversion parts and the charge transfer part on one side thereof. A channel stopper is provided between the row of photoelectric conversion parts and the charge transfer part on the other side thereof, and the channel stopper prevents signal charges, which are generated in each photoelectric conversion part, from leaking to the other charge transfer parts.

The CCD solid-state imaging device shown in FIG. 1 includes a semiconductor substrate 11, a first conductivity type region, such as a p-type well region, formed in the substrate 11, and photoelectric conversion parts 12 each including a second conductivity type region, such as an n-type impurity region, formed in the surface part of the first conductivity type region. Signal charges are generated by photoelectric conversion in the region at and around the p-n junction between the semiconductor substrate 11 and each photoelectric conversion part 12, and stored in each photoelectric conversion part 12 for a certain period of time.

Charge transfer parts 13 composed mainly of a second conductivity type impurity region are each formed at a certain distance from the photoelectric conversion part 12. Although not shown, a first conductivity type impurity region is formed between the photoelectric conversion part 12 and one of the charge transfer parts 13 to form a variable potential barrier for the read gate part. Between the photoelectric conversion part 12 and the other charge transfer part 13, a high-density, first conductivity type impurity region is formed as a channel stopper deeply in the semiconductor substrate 11.

An insulating layer 15 such as a silicon oxide layer is formed on the semiconductor substrate 11. A charge transfer electrode 14 of polysilicon or the like is formed on the insulating layer 15 above each charge transfer part 13. The signal charges generated by photoelectric conversion at the photoelectric conversion part 12 are read to one of the charge transfer parts 13 through the read gate part. The charge transfer electrodes 14 are driven by vertical transfer clock signals such as 4-phase clock signals so that the signal charges are successively transferred in a specific direction within the charge transfer part 13. The signal charges for each line are then swept into a horizontal transfer part (not shown), and the signal charges are transferred within the horizontal transfer part, for example, by 2-phase horizontal clock signals, and then output as image signals to the outside.

An insulating layer 15 such as a silicon oxide layer is also formed on the charge transfer electrode 14 as well as on the semiconductor substrate 11. A light-shielding layer 16 of a refractory metal such as tungsten (W) is formed on the insulating layer 15. The light-shielding layer 16 has an opening above each photoelectric conversion part 12. The periphery of the opening is located slightly inside relative to the steps of the charge transfer electrodes 14. The purpose of this structure is to enhance the light-shielding properties of the light-shielding layer 16 for the charge transfer parts 13 and to suppress smear.

A first optically-transparent insulating layer 17 made of such a material as PSG (phosphosilicate glass) or BPSG (borophosphosilicate glass) is provided on the light-shielding layers 16 and over the semiconductor substrate 11. The first optically-transparent insulating layer 17 has a dent immediately above each photoelectric conversion part 12. The dent has a curved surface that reflects the geometry of the steps of the underlying charge transfer electrodes 14 and light-shielding layer 16.

A second optically-transparent insulating layer 18 is formed on the first optically-transparent insulating layer 17 in such a manner that the dent of the first optically-transparent insulating layer 17 is filled with the second optically-transparent insulating layer 18. The second optically-transparent insulating layer 18 is made of a material having a refractive index higher than that of the first optically-transparent insulating layer 17, such as silicon nitride (P—SiN) produced by plasma CVD (chemical vapor deposition). The second optically-transparent insulating layer 18 has a planarized surface, and the first and second optically-transparent insulating layers 17 and 18 form an in-layer lens.

A first planarizing layer 19 is formed on the second optically-transparent insulating layer 18. Color filters 20 are disposed on the first planarizing layer 19.

The first planarizing layer 19 is provided to planarize the top of the second optically-transparent insulating layer 18 on which the color filters 20 are formed. The first planarizing layer 19 also functions as an anti-reflection layer for the color filters formed thereon. The first planarizing layer 19 is preferably made of a material that is inexpensive and has transparency and heat resistance or other properties, and examples of such a material include an acrylic resin material, a styrene resin material, and an epoxy resin material. The first planarizing layer 19 may also be formed as a passivation layer (protective layer) of an inorganic material such as silicon nitride (SiN).

The color filters 20 are formed using primary color coding and have optically-transparent regions separated by a boundary region and each colored in any one of red (R), green (G), and blue (B). The color filters may be formed using complementary color coding, in which case the optically-transparent regions may each be colored in any one of yellow (Ye), magenta (Mg), cyan (Cy), and green (G). The color filters 20 each need to have optimal spectral characteristics and have different thicknesses for different colors in order to improve the sensitivity characteristics and the color reproducibility of the solid-state imaging device.

A second planarizing layer 21 is formed on the color filters 20. The second planarizing layer 21 is formed to provide a transparent flat layer on the color filters 20 having different thicknesses for different colors. The second planarizing layer 21 is preferably made of a material that is inexpensive and has transparency and heat resistance or other properties, and an acrylic thermosetting resin material, a styrene resin material, an epoxy resin material, or the like is preferably used to form the second planarizing layer 21. When the vertically layered structure is made thin for the purpose of improving the focusing properties of the solid-state imaging device, a resin material having both thermosetting and thermoplastic properties is preferably used, such as an acrylic resin material, a styrene resin material, or an epoxy resin material.

A stress relaxation layer 22 is formed on the second planarizing layer 21. A microlens layer 23 having convexly curved surfaces (lens surfaces) is disposed on the stress relaxation layer 22.

For example, the microlens layer 23 includes a silicon nitride (SiN) layer formed by an etch back process, which has a refractive index of about 2.

Light incident on the lens surfaces is converged by the microlens layer 23 and further converged by the in-layer lens described above, and enters each photoelectric conversion part 12. The microlens layer 23 is formed on the CCD imager surface in such a manner that unavailable region-forming interstices are as less as possible and that light above the light-shielding film can be effectively utilized to enter the photoelectric conversion part 12. This increases the pixel sensitivity.

The stress relaxation layer 22 is provided to attenuate the difference in film stress between the second planarizing layer made of an organic material as described above and the microlens layer 23 made of an inorganic material.

As described above, there is a significant difference in film stress between the organic material layer and the inorganic material layer. Thus, if a microlens layer 23 made of an inorganic material such as SiN is placed directly on a second planarizing layer 21 made of an organic material such as a resin material, wrinkling or distortion will occur at the interface due to the difference in film stress. In other words, if the inorganic material layer and the organic material layer are laminated to each other, a defect in the film shape will occur at the interface between the layers due to the difference in film stress.

To solve this problem, the solid-state imaging device with the structure shown in FIG. 1 has the stress relaxation layer 22 in a laminate including the organic material layer and the inorganic material layer, and the stress relaxation layer 22 has a stress value that is different from and between the stress values of the organic material layer and the inorganic material layer. In other words, the stress relaxation layer that satisfies the following relation: the stress of the inorganic material layer>the stress of the stress relaxation layer>the stress of the organic material layer, is interposed between the inorganic material layer and the organic material layer.

As described above, before the inorganic material layer is formed on the organic material layer, a material having a stress value between the stress values of the organic material layer and the inorganic material layer is used to form a layer having the function of attenuating the difference in film stress between these layers. This layer suppresses surface defects caused by the film stress difference even when a laminate including the inorganic material layer and the organic material layer is formed. As a result, layer interface defects such as wrinkling and distortion are suppressed, and patterning can be achieved with no problem in a subsequent lithographic process. Thus, degradation of the focusing properties of the solid-state imaging device can be avoided.

The stress relaxation layer 21 is preferably made of an inorganic material, and a low-temperature CVD process is preferably used to form a film of such a material. Specifically, for example, SiO, SiN, and a silicon compound represented by the compositional formula $SiO_xN_y$ are preferred, where $0<X\leq1$ and $0<Y\leq1$ (hereinafter, such a compound is expressed as SiON).

The second planarizing layer 21 is preferably made of a thermoplastic thermoset acrylic material, and the microlens layer 23 is preferably made of a low-temperature-deposited SiN film. In this case, the stress relaxation layer 22 may be a low-temperature-deposited SiON film, so that the stress relaxation layer 22 (SiON) and the microlens layer 23 (SiN) can be formed in the same CVD process with no additional process, which is highly convenient.

Concerning the optical properties, the stress relaxation layer 22 preferably has a refractive index of 1.4 to 2.0 and also preferably has transparency. Particularly when made of SiON, the stress relaxation layer 22 has a refractive index of 1.6 to 1.9, which can reduce the interface reflection between the microlens layer 23 of SiN (refractive index: 1.8 to 2.0) and the second planarizing layer 21 of acrylic resin (refractive index: 1.4 to 1.5). This results in an improvement in the focusing properties of the solid-state imaging device.

The stress relaxation layer 22 preferably has a film stress of −100 to 100 Mpa. As used herein, the film stress is the value measured using a thin film stress measurement system (wafer warpage measurement system FSM 500TC (VISION, INC.)). The film stress values shown below are also measured using this measurement system.

A transparent resin layer 24 with a planarized surface is provided on the microlens layer 23. The transparent resin layer 24 is made of an organic material with a refractive index of about 1.5, such as an acrylic resin, an epoxy resin, or a styrene resin.

When the microlens layer 23 is made of SiN with a refractive index of about 2 and the transparent resin layer 24 is made of an organic material with a refractive index of about 1.5, the focusing performance of the microlens is reliable in the solid-state imaging device.

While the above embodiment has shown a case where a single stress relaxation layer is formed, any number of stress relaxation layers may be provided between the organic material layer and the inorganic material layer. For example, a plurality of stress relaxation layers made of different materials may be provided between the organic material layer and the inorganic material layer. In this case, the stress relaxation layers may be formed in such a manner that the difference in film stress between each pair of adjacent layers is adjusted smaller, so that surface defects at each layer interface can be further suppressed.

2. Second Embodiment of Solid-State Imaging Device

While the first embodiment has shown a case where the present invention is applied to a CCD solid-state imaging device as an example of the solid-state imaging device, the present invention may also be applied to other types of solid-state imaging devices.

Solid-state imaging devices are broadly classified into charge transfer-type solid-state imaging devices, typified by CCD solid-state imaging devices, and X-Y address-type solid-state imaging devices, typified by CMOS (complementary metal oxide semiconductor) solid-state imaging devices. Herein, the cross-sectional structure of a CMOS solid-state imaging device as an example of the X-Y address-type solid-state imaging device is described with reference to FIG. 2. The same reference signs are used to denote the same features as those of the first embodiment shown in FIG. 1, and descriptions thereof are omitted.

Although not shown specifically, the CMOS solid-state imaging device has pixel parts, a vertical (V) selection circuit, a S/H (sample/hold)-CDS (correlated double sampling) circuit, a horizontal (H) selection circuit, a timing generator (TG), and other parts, which are mounted on a single substrate. The pixel parts include a large number of unit pixels (described below) arranged in a matrix, address lines arranged in rows, and vertical signal lines arranged in columns. The pixel signal from each pixel is read through the vertical selection circuit to the S/H & CDS circuit and the horizontal selection circuit. The vertical selection circuit, the S/H-CDS circuit, and the horizontal selection circuit each operate based on different timing signals produced by the timing generator.

Figure 2:
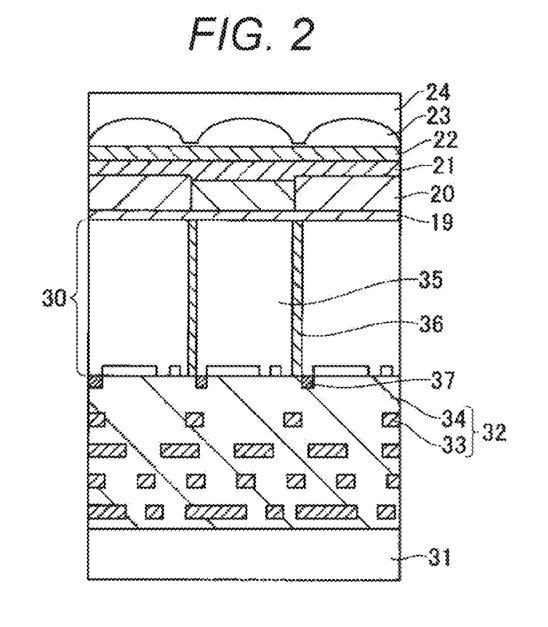
FIG. 2 is a cross-sectional view showing the structure of a solid-state imaging device according to a second embodiment of the present invention.

FIG. 2 is a cross-sectional view showing an example of the structure of the pixel parts and the peripheral circuit parts in the CMOS solid-state imaging device. The CMOS solid-state imaging device according to this embodiment has a backside illumination type pixel structure in which incident light enters the side (backside) of a semiconductor substrate opposite to its side on which a wiring layer is formed. The backside illumination type pixel structure has no wiring layer between a microlens and a photodiode (photoelectric conversion part), which increases the flexibility of wiring for pixels and makes it possible to form finer pixels.

The backside illumination type CMOS solid-state imaging device includes a semiconductor substrate 30 and an active layer that is formed in the semiconductor substrate 30 and includes a plurality of pixel parts each having a photoelectric conversion part (for example, a photodiode) 35 for converting incident light to an electric signal, transistors 37, and other components. The transistors 37 include a transfer transistor, an amplification transistor, a reset transistor, and so on, part of which is shown in FIG. 2. For example, a silicon substrate is used as the semiconductor substrate 30. A signal processing part (not shown) is further formed for processing signal charges read from each photoelectric conversion part 35. In the semiconductor substrate 30, an element isolation region 36 is formed at part of the periphery of the pixel part, for example, between the pixel parts arranged in the row or column direction.

A wiring layer 32 is formed on the front side of the semiconductor substrate 30 (the lower side of the semiconductor substrate 30 in the drawing) having the photoelectric conversion parts 35. The wiring layer 32 includes lines 33 and an insulating layer 34 with which the lines 33 are covered. The wiring layer 32 is provided with a supporting substrate 31 on the side opposite to the semiconductor substrate 30. For example, the supporting substrate 31 includes a silicon substrate.

The CMOS solid-state imaging device shown in FIG. 2 further includes a first planarizing layer 19 with optical transparency formed on the backside of the semiconductor substrate 30 (the upper side of the semiconductor substrate 30 in the drawing). Color filters 20 are disposed on the first planarizing layer 19.

A second planarizing layer 21 is formed on the color filters 20. A stress relaxation layer 22 is formed on the second planarizing layer 21. A microlens layer 23 having convexly curved surfaces (lens surfaces) is disposed on the stress relaxation layer 22. A transparent resin layer 24 having a planarized surface is provided on the microlens layer 23.

The first planarizing layer 19, the color filters 20, the second planarizing layer 21, the stress relaxation layer 22, the microlens layer 23, and the transparent resin layer 24, which are formed on the backside of the semiconductor substrate 30, may have the same features as those in the CCD solid-state imaging device of the first embodiment described above.

In the backside illumination type CMOS solid-state imaging device configured as described above, the stress relaxation layer 22 is interposed between the organic material layer and the inorganic material layer in the laminate, and the stress relaxation layer 22 has a stress value that is different from and between the stress values of the organic and inorganic material layers. According to this feature, the difference in film stress between the organic and inorganic material layers can be attenuated in the laminate including the organic material layer, the stress relaxation layer 22, and the inorganic material layer. Thus, surface defects caused by the film stress difference can be suppressed even when organic and inorganic material layers significantly different in film stress are used to form the laminate.

As described above, the backside illumination type CMOS solid-state imaging device having the stress relaxation layer between the organic and inorganic material layers can produce the same advantageous effect as the CCD solid-state imaging device in the first embodiment.

3. Third Embodiment of Solid-State Imaging Device

While the second embodiment has shown a backside illumination type CMOS solid-state imaging device as an example of the solid-state imaging device to which the present invention is applied, the present invention may also be applied to what is called a front-side illumination type CMOS solid-state imaging device, in which a wiring layer is provided on the front side and incident light enters the wiring layer side.

Figure 3:
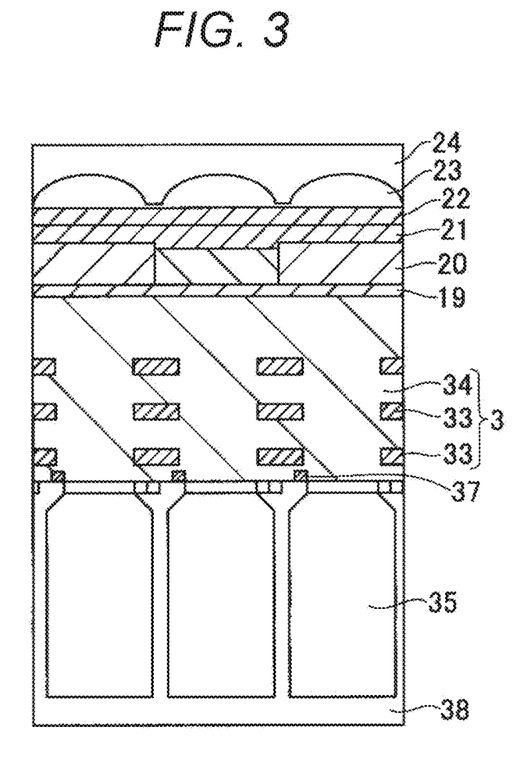
FIG. 3 is a cross-sectional view showing the structure of a solid-state imaging device according to a third embodiment of the present invention.

FIG. 3 is a cross-sectional view schematically showing the structure of such a front-side illumination type CMOS solid-state imaging device. The same reference signs are used to denote the same features as those of the first and second embodiments shown in FIGS. 1 and 2, and descriptions thereof are omitted.

The front-side illumination type CMOS solid-state imaging device shown in FIG. 3 includes a semiconductor substrate 38 and a plurality of pixel parts that are formed in the semiconductor substrate 38 and each have a photoelectric conversion part (for example, a photodiode) 35 for converting incident light to an electric signal, transistors 37, and other components. The transistors 37 include a transfer transistor, an amplification transistor, a reset transistor, and so on, part of which is shown in FIG. 3. For example, a silicon substrate is used as the semiconductor substrate 38. A signal processing part (not shown) is further formed for processing signal charges read from each photoelectric conversion part 35.

A wiring layer 32 is formed on the front side of the semiconductor substrate 38 (the upper side of the semiconductor substrate 30 in the drawing) having the photoelectric conversion parts 35. The wiring layer 32 includes lines 33 and an insulating layer 34 with which the lines 33 are covered.

The CMOS solid-state imaging device further includes a first planarizing layer 19 with optical transparency formed on the wiring layer 32. Color filters 20 are disposed on the first planarizing layer 19.

A second planarizing layer 21 is formed on the color filters 20. A stress relaxation layer 22 is formed on the second planarizing layer 21. A microlens layer 23 having convexly curved surfaces (lens surfaces) is disposed on the stress relaxation layer 22. A transparent resin layer 24 having a planarized surface is provided on the microlens layer 23.

The wiring layer 32 formed on the front side of the semiconductor substrate 38 may have the same feature as that in the CMOS solid-state imaging device of the second embodiment described above. The first planarizing layer 19, the color filters 20, the second planarizing layer 21, the stress relaxation layer 22, the microlens layer 23, and the transparent resin layer 24, which are formed on the wiring layer 32, may also have the same features as those in the CCD solid-state imaging device of the first embodiment described above.

In the front-side illumination type CMOS solid-state imaging device configured as described above, the stress relaxation layer 22 is interposed between the organic material layer and the inorganic material layer in the laminate, and the stress relaxation layer 22 has a stress value that is different from and between the stress values of the organic and inorganic material layers, and thus has the function of attenuating the difference in film stress between the organic and inorganic material layers. This makes it possible to suppress surface defects caused by the film stress difference even when a laminate including inorganic and organic material layers is formed.

Thus, the front-side illumination type CMOS solid-state imaging device configured as described above and having the stress relaxation layer between the organic and inorganic material layers can also produce the same advantageous effect as the CCD solid-state imaging device in the first embodiment.

4. Embodiment of Method for Manufacturing Solid-State Imaging Device

Next, a description is given of an embodiment of the method for manufacturing a solid-state imaging device of the present invention. The manufacturing process drawings described below are cross-sectional views of the structure of the color filters and upper layers, which is common to the light-receiving regions of the CCD solid-state imaging device of the first embodiment and the CMOS solid-state imaging devices of the second and third embodiments. The manufacturing process drawings and the manufacturing process described below with reference to the manufacturing process drawings only show the features of the color filters and upper layers formed on the light-receiving region, and other features are omitted from the drawings. Hereinafter, a description is given of a method for manufacturing the CCD solid-state imaging device of the first embodiment shown in FIG. 1, as an example of the method for manufacturing a solid-state imaging device.

First, various impurity regions are formed on the principal surface side of a semiconductor substrate according to known methods. An n-type impurity such as phosphorus is introduced into the principal surface side of a semiconductor substrate such as a p-type silicon substrate by such a method as ion implantation to form photodiodes as photoelectric conversion parts. Similarly, n- or p-type impurity ions are then introduced to form a channel stop, a transfer channel, and other parts.

An insulating layer is formed by a thermal oxide film-forming method or the like on the semiconductor substrate having the elements formed as described above. Subsequently, a polysilicon layer or the like is formed on the insulating layer by CVD or the like, and then selectively etched into a predetermined pattern by dry etching or the like to form transfer electrodes. An insulating layer such as a silicon oxide layer is further formed over the top and side surfaces of the transfer electrodes. A film of refractory metal such as tungsten is formed on the insulating layer by CVD, and then patterned in such a manner that an opening is formed above each photoelectric conversion part, so that a light-shielding layer is formed.

Subsequently, a first optically-transparent insulating layer of PSG or BPSG is formed on the light-shielding layer and above the openings. The formed first optically-transparent insulating layer is then allowed to reflow, for example, by heating at 900° C. to 1,000° C., so that a dent is formed above each photoelectric conversion part in the first optically-transparent insulating layer in such a manner as to reflect the geometry of the steps of the underlying transfer electrodes and light-shielding layer and to have the same size as the photoelectric conversion part. A silicon nitride (P—SiN) layer is then formed as a second optically-transparent insulating layer on the first optically-transparent insulating layer by plasma CVD. A first planarizing layer is formed on the second optically-transparent insulating layer by spin coating or the like, for example, using acrylic resin, polyimide resin, isocyanate resin, or the like.

As shown in FIG. 4A, color filters 20 corresponding to the respective photoelectric conversion parts are then formed on the first planarizing layer. A second planarizing layer 21 is then formed on the color filters 20.

The color filters 20 are formed by a known method such as a dyeing process. The dyeing process includes forming a coating of a mixture of a resin material and a photosensitizer, subjecting the coating to exposure, development, dyeing, and fixation, and repeating the process for the respective colors to form the color filters 20. Any other method such as a dispersion process, a printing process, or an electrodeposition process may also be used to form the color filters 20.

The second planarizing layer 21 is formed using an organic resin material, particularly, a thermosetting transparent resin material such as an acrylic resin material, a styrene resin material, or an epoxy resin material. In order to make the second planarizing layer 21 thin and flat, the resin material to be used preferably has both thermosetting and thermoplastic properties. More specifically, the second planarizing layer 21 can be formed using a material such as FOC-UV27 manufactured by FUJI CHEMICALS INDUSTRIAL CO., LTD.

The second planarizing layer 21 can be formed by a process including applying this material to the color filters 20 by spin coating and subjecting the applied material to a thermosetting treatment for several minutes at a temperature where heat deterioration of the color filters and other parts does not occur, such as 200 to 230° C.

As shown in FIG. 4B, a stress relaxation layer 22 is then formed on the second planarizing layer 21. For example, the second planarizing layer 21 is formed as described above by plasma CVD at 200 to 230° C. for several minutes using SiN, SiO, SiON, or the like.

As shown in FIG. 4C, a microlens layer 23 is formed on the stress relaxation layer 22. The microlens layer 23 is formed by plasma CVD at 200 to 230° C. for several minutes using an inorganic material such as SiN.

As shown in FIG. 5D, a resist layer 25 is formed on the microlens layer 23 by coating. The resist layer 25 is formed into lens shapes by patterning it using photolithography and thermosetting the patterned resist layer. The patterning into lens shapes is performed by an exposure process using an i-line stepper or the like. A material with low heat resistance is suitable as the resist material used to from the resist layer 25. For example, a material such as PFI-65 manufactured by Sumitomo Chemical Company, Limited, can be used as the resist material.

As shown in FIG. 5E, the microlens layer 23 is formed into lens shapes by an etching process using the resist layer 25 as a mask. For example, the microlens layer 23 including an inorganic material such as SiN is etched by a plasma dry etching method using $CF_4/O_2$ gas or the like.

As shown in FIG. 5F, a transparent resin layer 24 is then formed on the lens-shaped microlens layer 23. The transparent resin layer 24 is formed by a process including forming a coating of an organic resin material or the like using spin coating or other coating techniques and then subjecting the coating to a thermosetting treatment for several minutes at a temperature where heat deterioration of the color filters and other parts does not occur, such as 200 to 230° C. The material used to form the transparent resin layer 24 preferably has transparency and a low refractive index. More specifically, a material such as TT8021 manufactured by JSR Corporation, can be used.

The steps described above enable the manufacture of the CCD solid-state imaging device having the structure shown in FIG. 1.

Figure 4:
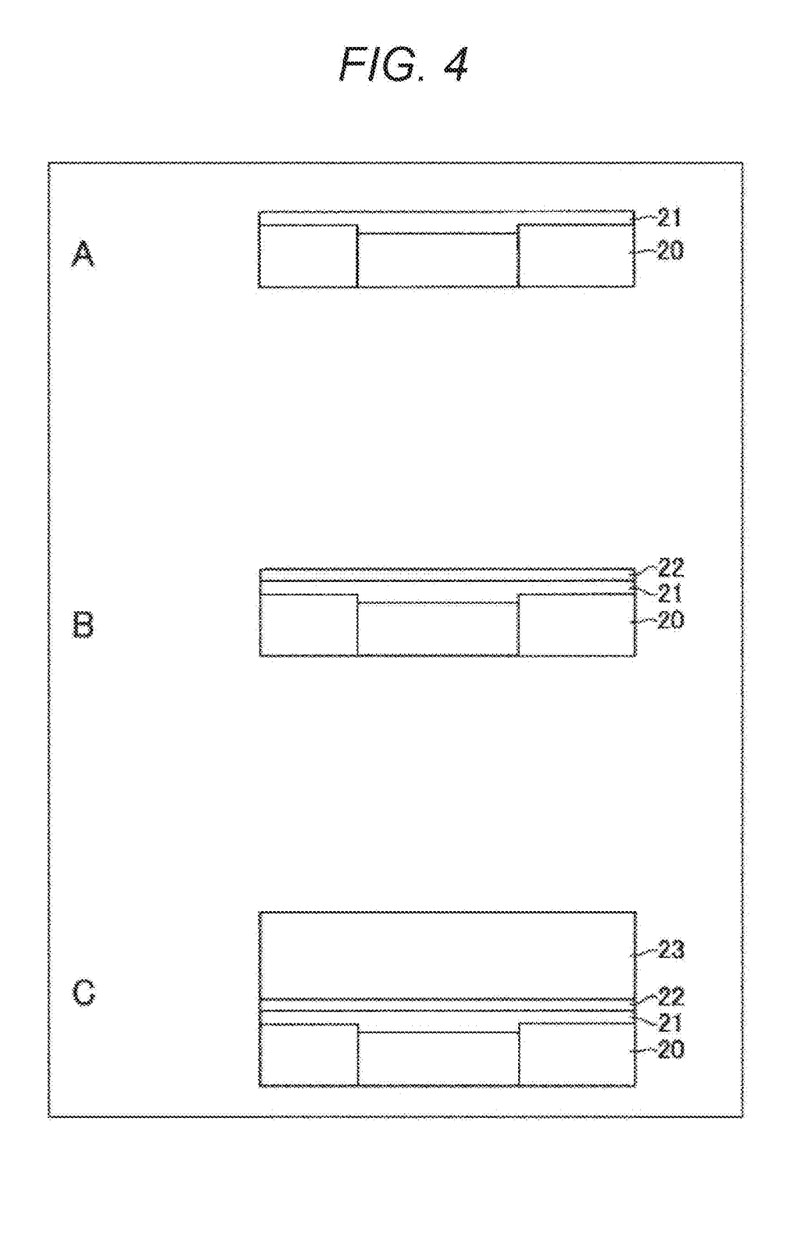
FIGS. 4A to 4C are diagrams showing the process for manufacturing the solid-state imaging device according to an embodiment of the present invention.
Figure 5:
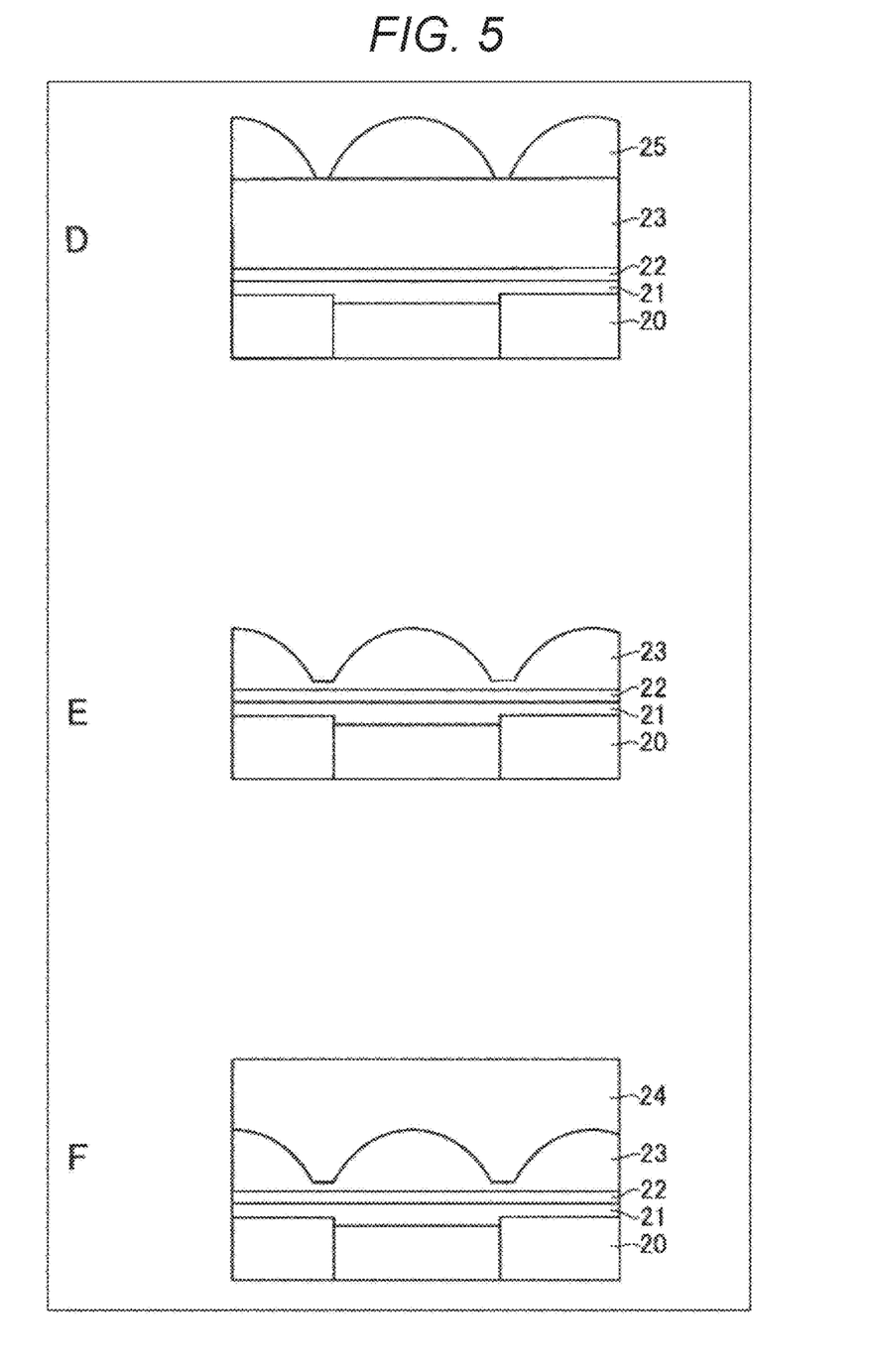
FIGS. 5D to 5F are diagrams showing the process for manufacturing the solid-state imaging device according to an embodiment of the present invention.

According to the steps shown in FIGS. 4 and 5, the back-side illumination type CMOS solid-state imaging device and the front-side illumination type CMOS solid-state imaging device can also be manufactured in a similar manner.

In the case of the backside illumination type CMOS solid-state imaging device, photoelectric conversion regions and a group of transistors are formed in the semiconductor substrate, and then the parts from the color filters to the transparent resin layer are formed by the process described above on the side of the semiconductor substrate opposite to the wiring layer side. In the case of the front-side illumination type CMOS solid-state imaging device, photoelectric conversion regions and a group of transistors are formed in the semiconductor substrate, and then the wiring layer is formed on the semiconductor substrate. Subsequently, the parts from the color filters to the transparent resin layer are formed on the wiring layer by the process described above.

The process described above enables the manufacture of the CMOS solid-state imaging device having the stress relaxation layer according to the embodiment described above.

While the embodiment of the manufacturing method has shown a case where a single stress relaxation layer is formed as shown in FIG. 4B, any number of stress relaxation layers may be provided between the organic material layer and the inorganic material layer. For example, a plurality of stress relaxation layers of different materials may be formed between the organic material layer and the inorganic material layer by repeating twice or more the step of forming a stress relaxation layer of SiN, SiO, SiON, or the like using plasma CVD. In this case, the stress relaxation layers may be formed in such a manner that the difference in film stress between each pair of adjacent layers is adjusted smaller, so that surface defects at each layer interface can be further suppressed.

The second planarizing layer may be made of an acrylic thermoplastic thermoset material, and the microlens layer may be made of low-temperature-deposited SiN. In this case, the stress relaxation layer may be made of low-temperature-deposited SiON, so that the solid-state imaging device can be formed with no additional process. This method is highly convenient because it enables continuous production of SiON and SiN layers for the stress relaxation and microlens layers in the same CVD process.

If the stress relaxation layer of SiON is absent under the microlens layer in the step of etching back the microlens layer using the resist layer, an etching stop time needs to be set within a certain time limit. In this case, variations in structure may often occur. In contrast, when the stress relaxation layer of SiON is provided under the microlens layer, the SiON layer can function as an etching stopper layer to stop the etching accurately. Thus, the stress relaxation layer made of SiON can reduce variations in microlens structure and improve focusing properties.

5. Embodiment of Electronic Apparatus

The solid-state imaging device according to the present invention may be used to form an electronic apparatus, such as a solid-state imaging device-equipped camera, a camera-equipped cellular phone, or any other solid-state imaging device-equipped apparatus.

Figure 6:
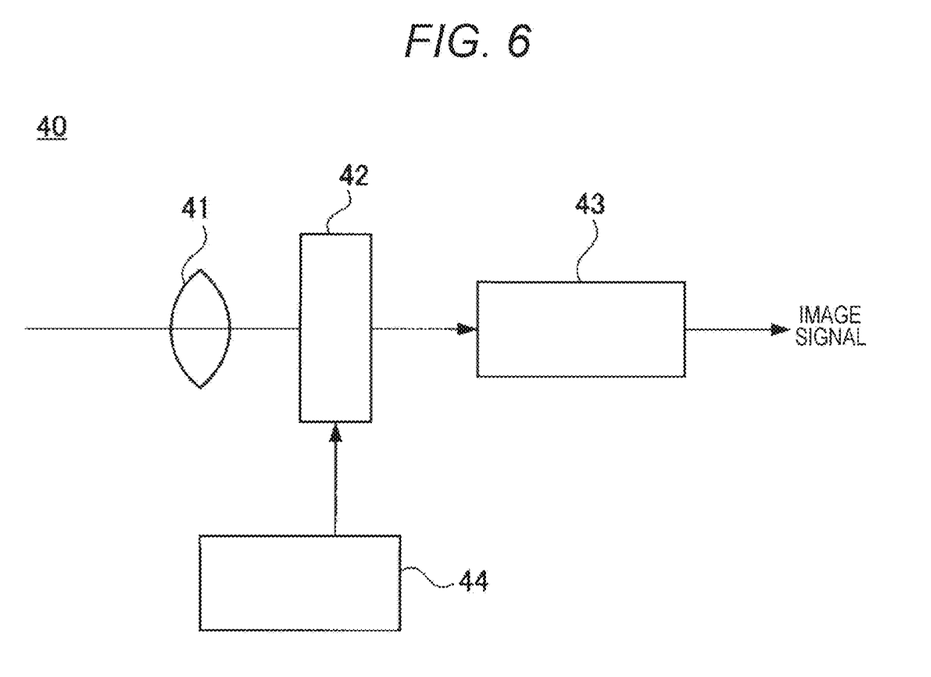
FIG. 6 is a diagram showing a schematic structure of an electronic apparatus according to the present invention.

FIG. 6 schematically shows the configuration of a digital still camera capable of taking still pictures, as an example of the electronic apparatus of the present invention, in which the solid-state imaging device is used.

A camera 40 according to this embodiment includes an optical system (optical lens) 41, a solid-state imaging device 42, a signal processing circuit 43, and a drive circuit 44.

The solid-state imaging device described above is used as the solid-state imaging device 42. The optical lens 41 focuses image light (incident light) from an object onto the imaging surface of the solid-state imaging device 42. Thus, signal charges are stored in the photoelectric conversion elements of the solid-state imaging device 42 for a certain period of time. The drive circuit 44 supplies signals for the transfer operation of the solid-state imaging device 42. The solid-state imaging device 42 performs signal transfer in response to drive signals (timing signals) supplied from the drive circuit 44. The signal processing circuit 43 performs various signal processing operations in response to the output signals from the solid-state imaging device 42. The video signals having undergone the signal processing are stored in a storage medium such as a memory or output to a monitor or the like. In this embodiment, the camera 40 includes a camera module in which the optical lens 41, the solid-state imaging device 42, the signal processing circuit 43, and the drive circuit 44 are assembled into the module.

The present invention can provide a camera as shown in FIG. 6 and other apparatuses including camera-equipped portable apparatuses such as camera module-equipped cellular phones.

According to the configuration shown in FIG. 6, the optical lens 41, the solid-state imaging device 42, the signal processing circuit 43, and the drive circuit 44 may be assembled into a module with an imaging function, or specifically an imaging function module. The present invention can provide an electronic apparatus having such an imaging function module.

It will be understood that the embodiments described above are not intended to limit the present invention and various changes and modifications are possible without departing from the scope of the present invention.

REFERENCE SIGNS LIST 11, 30, 38 Semiconductor substrate
12, 35 Photoelectric conversion part
13 Charge transfer part
14 Charge transfer electrode
15 Insulating layer
16 Light-shielding layer
17 First optically-transparent insulating layer
18 Second optically-transparent insulating layer
19 First planarizing layer
20, 101 Color filter
21 Second planarizing layer
22 Stress relaxation layer
23, 103 Microlens layer
24, 104 Transparent resin layer
25, 105 Resist layer
31 Supporting substrate
32 Wiring layer
33 Line
34 Insulating layer
36 Element isolation region
37 Transistor
40 Camera
41 Optical system (optical lens)
42 Solid-state imaging device
43 Signal processing circuit
44 Drive circuit
102 Planarizing layer

The invention claimed is:
1. A solid-state imaging device comprising:
a semiconductor substrate;
a photoelectric conversion part formed in the semiconductor substrate;

a laminate including an organic material layer and an inorganic material layer placed on the semiconductor substrate; and at least one stress relaxation layer interposed between the organic material layer and the inorganic material layer.

2. The solid-state imaging device according to claim 1, wherein the stress relaxation layer has a film stress that is different from and between a film stress of the organic material layer and a film stress of the inorganic material layer.

3. The solid-state imaging device according to claim 2, wherein the organic material layer is a planarizing layer, and the inorganic material layer is a microlens layer.

4. The solid-state imaging device according to claim 1, wherein the stress relaxation layer comprises at least one material selected from SiO, SiN, and a silicon compound represented by the compositional formula $SiO_xN_y$, where $0<X\le 1$ and $0<Y\le 1$.

5. The solid-state imaging device according to claim 1, wherein the stress relaxation layer has a refractive index of 1.4 to 2.0.

6. A method for manufacturing a solid-state imaging device, comprising the steps of:

forming a photoelectric conversion part in a semiconductor substrate; and forming a laminate including an organic material layer and an inorganic material layer on the semiconductor substrate with at least one stress relaxation layer interposed between the organic material layer and the inorganic material layer.

7. An electronic apparatus comprising:

a solid-state imaging device comprising a semiconductor substrate, a photoelectric conversion part formed in the semiconductor substrate, a laminate including an organic material layer and an inorganic material layer placed on the semiconductor substrate, and at least one stress relaxation layer interposed between the organic material layer and the inorganic material layer;

an optical system for guiding incident light to an imaging part of the solid-state imaging device; and a signal processing circuit for processing an output signal from the solid-state imaging device.

* * * * *